(12) United States Patent
Scordino et al.

(10) Patent No.: US 8,944,657 B2
(45) Date of Patent: Feb. 3, 2015

(54) LIGHT SOURCE

(75) Inventors: Alessandro Scordino, Venezia/Mestre (IT); Julius Muschawek, Gauting (DE); Jan Marfeld, Regensburg (DE)

(73) Assignees: OSRAM Opto Semiconductors GmbH, Regensburg (DE); OSRAM Gesellschaft mit beschränkter Haftung, Munich (DE)

( * ) Notice: Subject to any disclaimer, the term of this patent is extended or adjusted under 35 U.S.C. 154(b) by 879 days.

(21) Appl. No.: 12/602,444

(22) PCT Filed: May 28, 2008

(86) PCT No.: PCT/EP2008/004257
§ 371 (c)(1),
(2), (4) Date: May 28, 2010

(87) PCT Pub. No.: WO2008/145360
PCT Pub. Date: Dec. 4, 2008

(65) Prior Publication Data
US 2011/0044037 A1    Feb. 24, 2011

(30) Foreign Application Priority Data
May 31, 2007    (EP) .................................... 07010836

(51) Int. Cl.
*F21V 7/04* (2006.01)
*H01L 33/00* (2010.01)
*H01L 33/58* (2010.01)
*F21K 99/00* (2010.01)
*G02B 19/00* (2006.01)
*H01L 25/075* (2006.01)
*H01L 33/60* (2010.01)

(52) U.S. Cl.
CPC . *H01L 33/58* (2013.01); *F21K 9/00* (2013.01); *G02B 19/0057* (2013.01); *G02B 19/0047* (2013.01); *G02B 19/0028* (2013.01); *H01L 25/0753* (2013.01); *H01L 33/60* (2013.01)
USPC ...................................... 362/555; 362/311.02

(58) Field of Classification Search
USPC ................ 362/249.02, 311.02, 555, 612, 800
See application file for complete search history.

(56) References Cited

U.S. PATENT DOCUMENTS

| 3,875,456 | A | 4/1975 | Kano et al. |
| 7,717,599 | B2 * | 5/2010 | Grace et al. .................... 362/555 |
| 2004/0070855 | A1 | 4/2004 | Benitez et al. |
| 2006/0091784 | A1 | 5/2006 | Conner et al. |
| 2006/0120251 | A1 | 6/2006 | Sakamoto et al. |
| 2007/0008734 | A1 | 1/2007 | Bogner et al. |
| 2008/0062682 | A1 | 3/2008 | Hoelen et al. |
| 2009/0201677 | A1 | 8/2009 | Hoelen et al. |

FOREIGN PATENT DOCUMENTS

| CN | 1701362 | 11/2005 |
| CN | 1726410 | 1/2006 |

(Continued)

*Primary Examiner* — Jason Moon Han
(74) *Attorney, Agent, or Firm* — Cozen O'Connor

(57) ABSTRACT

A light source comprises a light-emitting device to emit electromagnetic radiation from an emitting surface and an optical element having a light input surface, a light output surface and side surfaces connecting the light input surface to the light output surface. The light input surface is located in the optical path of the light-emitting device, the electromagnetic radiation entering the optical element through the light input surface, and the light input surface has a concave curvature and an area being smaller than the area of the light output surface.

17 Claims, 7 Drawing Sheets

(56) References Cited

FOREIGN PATENT DOCUMENTS

| CN | 1767969 | 5/2006 |
|----|---------|--------|
| WO | WO 2004/034100 | 4/2004 |
| WO | WO 2004/088200 | 10/2004 |
| WO | WO 2006/033032 | 3/2006 |
| WO | WO 2006/043195 | 4/2006 |
| WO | WO 2006/049801 | 5/2006 |
| WO | WO 2006/109113 | 10/2006 |

* cited by examiner

LIGHT SOURCE

RELATED APPLICATIONS

This is a U.S. national stage of application No. PCT/EP2008/004257, filed on May 28, 2008.

This patent application claims the priority of European patent application 07010836.0, the disclosure content of which is hereby incorporated by reference.

FIELD OF THE INVENTION

The present invention is related to a light source that includes a light-emitting device.

SUMMARY OF THE INVENTION

One object of the present invention is to provide a light source comprising a light-emitting device and an optical element.

This and other objects are attained in accordance with one aspect of the present invention directed to a light source comprising a light-emitting device emitting electromagnetic radiation from an emitting surface and an optical element having a light input surface, a light output surface and side surfaces connecting the light input surface to the light output surface, wherein
the light input surface is located in the optical path of the light-emitting device, the electromagnetic radiation entering the optical element through the light input surface, and
the light input surface has a concave curvature and an area being smaller than the area of the light output surface.

Here and in the following, "electromagnetic radiation" and "light" are used synonymously, both denoting electromagnetic radiation having a wavelength or a combination of wavelengths ranging from ultra-violet to infrared.

The light input surface may face towards the emitting surface of the light-emitting device. The concave curvature of the light input surface of the optical element may imply that the light input surface is curved and/or hollowed inward with respect to the volume of the optical element and thus is formed as a hollow or recess as seen from the light-emitting device. Because of the concave curvature of the light input surface light emitted by the light-emitting device can be coupled into the optical element very efficiently, since the concavely curved light input surface may cover a larger solid angle seen from the emitting surface than a flat input surface having the same surface area as the concavely curved light input surface. This may be in particular advantageous if the light-emitting device provides a light emission with an angular distribution, i.e. the light-emitting device may emit light into different directions covering an emitting solid angle. For instance, the emitting surface of the light-emitting device may be flat and characterized by a plane having a surface normal which is orthogonal to the extension direction of the emitting surface. Light emitted by the light-emitting device may be characterized by an angular intensity distribution with respect to the surface normal of the emitting surface. For instance, the light-emitting device may provide a Lambertian emission characteristic, i.e. the light emitted by the light-emitting device may provide a cosine-like intensity distribution with respect to the surface normal of the emitting surface. This may imply that a significant part of the emitted light is emitted in directions which are not orthogonal to the emitting surface, resulting in the emitting solid angle. The part of the emitted light which is emitted in directions being not orthogonal to the emitting surface and which thus deviates from the surface normal of the emitting surface may be efficiently coupled into the optical element as the concavely curved light input surface of the optical element may cover a solid angle which is equal or close to the emitting solid angle of the light-emitting device. Thus, the light input surface can capture all or almost all light, e.g. more than 80 percent or more than 85 percent or even more than 90 percent of the light emitted from the light-emitting device.

As the light output surface has a larger surface area than the light input surface, the optical element may further provide concentration of the light passing through the optical element so that the solid angle into which the light is emitted from the light output surface is smaller than the emitting solid angle of the light-emitting device into which the light is emitted from the emitting surface of the light-emitting device. This may imply that the optical element may provide collimation of the light passing through the optical element. Concentration and/or collimation may occur because of etendue conservation, which is a fundamental optical law, follows that one can achieve concentration and/or collimation of a beam only at the expense of an enlarged cross section of the beam. For instance, the optical element may concentrate and/or collimate light emitted by the light-emitting element with a Lambertian intensity distribution into a cone-like beam with an opening angle between 20° and 60° or between 30° and 50° or for example about 38°.

The light input surface may be formed as a part of an ellipsoid, a sphere, an elliptical paraboloid, or any mixture thereof. The light input surface may be formed with a smooth surface or may include a plurality of flat surface sections which are inclined with respect to each other approximating one of the shapes mentioned before.

Furthermore, the light input surface may have a perimeter with a polygonal, circular or elliptical shape or any mixture thereof. Here and in the following, "perimeter" may denote the boundary line of a plane or curved surface. A polygonal shape may be for example a triangle, a quadrangle, in particular a rectangle, or any other regular or irregular polygon with n sides and corners, n being equal or greater than 3. The shape of the perimeter may be characterized by Euclidian geometry, i.e. the sides of the perimeter may be located in a plane, or by non-Euclidian, elliptical geometry, i.e. the sides of the perimeter may be located on the surface of an ellipsoid, a sphere, an elliptical paraboloid or any other curved or bent surface or any combination thereof.

The light output surface may have a shape which is similar to or different from the shape of the light input surface. This may imply that the light output surface may have a perimeter which is similar to or different from the perimeter of the light input surface. In particular, the perimeter of the light output surface may be polygonal, circular or elliptical or any mixture thereof. For example, the output surface may have a polygonal perimeter with the shape of a regular octagon, i.e. having an octagonal shape with eight corners. Furthermore, the perimeter of the light output surface may be characterized by Euclidian geometry, i.e. the sides of the perimeter may be located in a plane, or by non-Euclidian, elliptical geometry, i.e. the sides of the perimeter may be located on an ellipsoid, a sphere, an elliptical paraboloid or any other curved or bent surface or any mixture thereof.

Further, the light output surface may be flat. Alternatively, the light output surface may have a curvature, preferably a convex curvature. This may imply that the light output surface may bulge outward with respect to the volume of the optical element. A curved light output surface may provide collimation, focusing or defocusing of the light emerging from the optical element. For example the light output surface may be formed as a convex lens surface.

The side surfaces may be plane surfaces. Thus, the side surfaces may be not curved or bent and inclined with respect to each other. For instance, the optical element may have side surfaces which have the shape of triangles and/or side surfaces which have the shape of quadrangles, in particular trapezoids. The optical element may have a prismatoid-like shape and/or be a part of a cone or a pyramid, e.g. a conical or pyramid frustum, respectively, wherein the light input surface and the light output surface form the top and bottom surfaces of the frustum, respectively. Alternatively or additionally, one or more side surfaces may be curved and/or bent along the direction from the light input surface to the light output surface. The one or more side surfaces may be for example curved elliptically, circularly, parabolically, hyperbolically, or any combination thereof.

A first part of the electromagnetic radiation emitted by the light-emitting device may be coupled into the optical element, i.e. the first part may enter the optical element via the light input surface and pass, so that the first part directly illuminates the light output surface. This may imply that the first part of the light traverses the optical element from the light input surface to the light output surface without impinging the side surfaces. Preferably, the first part of the light may illuminate the whole light output surface. A second part of the electromagnetic radiation entering the optical element may impinge the side surfaces and may be reflected by the side surfaces via total internal reflection. Further, the second part of the light being reflected by the side surfaces towards the light output surface may illuminate the whole light output surface. Thus, both the first part of the electromagnetic radiation and the second part of the electromagnetic radiation, which in sum may be all electromagnetic radiation coupled into the optical element, may illuminate the whole light output surface. This may imply that, preferably, at every point of the light output surface and into every direction of the emerging light beam a mixture of light emerges from the optical element which passed directly, i.e. without being reflected at the side surfaces, and indirectly, i.e. with being reflected at at least one side surface, through the optical element. Thus, the optical element may be non-imaging, i.e. the light distribution at the light input surface is not projected onto the light output surface, and provide a homogeneous brightness and color distribution at the light output surface.

The optical element may include or may be made of glass, like quartz or optical glass, and/or plastic like epoxy resin, silicone, epoxy-silicon hybrid materials, polymethylmethacrylate, polycarbonate or any other plastic or any mixture thereof. In order to provide total internal reflection to the second part of the electromagnetic radiation as described above the optical element may include a material or may be made of a material which provides a refractive index which is larger than the refractive index of air, for example equal or larger than 1.5. For example, the optical element may include or be made of polycarbonate, which provides a refractive index of about 1.58 for light with a wavelength of about 640 nm and a refractive index of about 1.6 for light with a wavelength of about 480 nm.

The light-emitting device may comprise at least one light-emitting diode (LED). The LED may comprise an epitaxially grown semiconductor layer sequence on a substrate and may be based for example on a nitride semiconductor material system, e.g. InGaAlN. Alternatively, the semiconductor layer sequence may be based on InGaAlP or AlGaAs. Alternatively or additionally, the semiconductor layer sequence may also comprise other III-V-semiconductor material systems or II-VI-semiconductor systems or any combination of the described materials. The LED may further be formed as thin-film semiconductor chip. The semiconductor sequence may comprise an active area which is formed as a pn-transition, a double hetero structure, a single quantum-well structure or a multiple quantum-well structure. Further, the light-emitting device may comprise a housing and/or an optical component such as a lens, a diffuser and/or a wavelength converter. The housing may contain one or more of the LEDs. A diffuser may be advantageously positioned in the radiation path of the radiation-emitting device in particular when a homogenous light and intensity impression by an external observer is preferred. A luminescence converter may be combined with a semiconductor layer sequence in order to provide a mixed-colored or white light impression to an external observer.

Preferably, the LED may provide white light. For instance, the LED may comprise an active area which emits blue light and a luminescence converter which partly converts the blue light to yellow and/or green and red light. The luminescence converter may be formed as a layer on top of the semiconductor layer sequence or may be formed as encapsulation for the semiconductor layer sequence.

Further, the light-emitting device may comprise a plurality of LEDs. All of the plurality of LEDs may emit light with the same or with a similar spectral distribution and intensity. Alternatively, at least two of the plurality of LEDs may emit light with spectral distributions, respectively, which are different compared to each other. Further, the plurality of LEDs may be arranged forming an array of LEDs, for instance forming a rectangular or circular array. The emitting surface of the light-emitting device comprising a plurality of LEDs may be defined by the sum of the emitting surfaces of the individual LEDs of the plurality of LEDs.

The light input surface of the optical element may have a shape which is the same as or similar to the shape of the LED array. By way of example only, the LED array may be a rectangular array formed of 2 by 3 LEDs and the shape of the light input surface, i.e. its perimeter, may be rectangular as well. For example, the area of the emission surface may be equal to or greater than 9 mm$^2$ and/or equal to or smaller than 15 mm$^2$. The area of the light input surface may be equal to or greater than 28 mm$^2$ and/or equal to or smaller than 45 mm$^2$.

The light input surface of the optical element may be arranged at a distance from the emitting surface of the light-emitting device, thereby forming a gap between the light-emitting device and the optical element, i.e. between the light input surface and the emitting surface. Therefore, no index matching is required between the light-emitting device and the optical element. The distance, i.e. the width of the gap, may be equal to or greater than about 0.8 mm and/or may be equal to or smaller than about 2 mm, further equal to or greater than about 1 mm and/or equal to or smaller than about 1.5 mm. The larger the width of gap is the higher the life time of the light source may be, because the gap, which may be filled with gas, e.g. air, may provide a thermal insulation between the light-emitting device and the optical element as well as a dilution of the emitted electromagnetic radiation which has a high intensity close to the emitting surface.

Further, the area of the light input surface may be larger than the area of the emitting surface so that—in connection with the concave curvature of the light input surface as described above—light emitted in directions deviating from the surface normal of the emitting surface is efficiently coupled into the optical element. The ratio of the area of the light input surface to the area of the emitting surface may be equal to or greater than about 2 and/or may be equal to or smaller than about 5, for instance 4.

DETAILED DESCRIPTION OF THE DRAWINGS

Figure 1A:
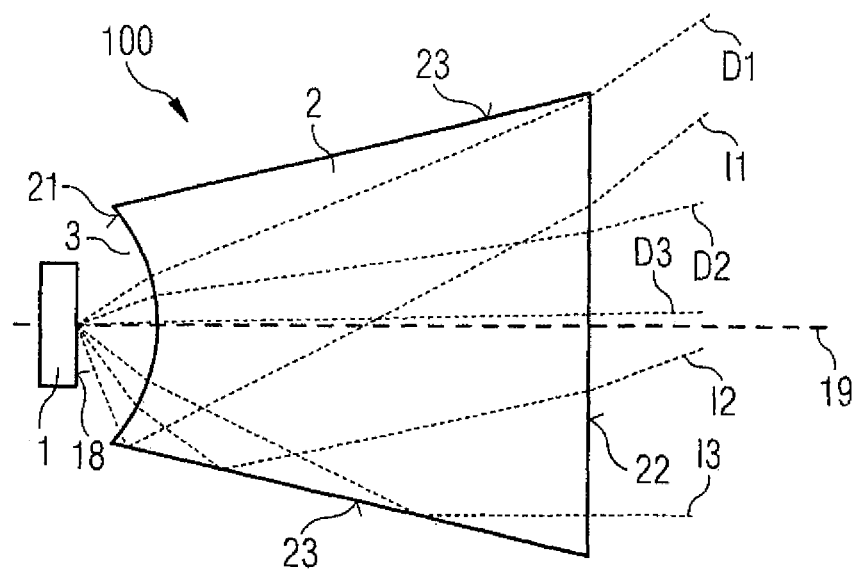
FIGS. 1A to 3B show schematic drawings of light sources according to various embodiments.

In the figures similar elements or elements with similar functions or functionalities are referred to by similar reference numerals. The shown elements and their sizes relative to each other are not intended to be drawn to scale. In contrast, some or all elements, e.g. layers, devices, and/or parts, elements, and regions thereof, may be drawn exaggeratedly in size and/or thickness in order to provide a better understanding of the shown embodiments.

FIG. 1A shows a schematic drawing of a cross-sectional view of light source 100 according to at least one embodiment. Light source 100 includes light-emitting device 1 and optical element 2.

The light-emitting device 1 is shown in greater detail in FIG. 1B and will be described first. The light-emitting device 1 includes an LED 11 has a semiconductor layer sequence 14 with an active area 15. The semiconductor sequence 14 shown in this particular embodiment is based on a nitride semiconductor material and provides, by way of example only, the emission of blue light upon application of an electrical current to the active area 15. A luminescence converter 16, formed as a layer applied to the semiconductor layer sequence 14, converts part of the blue light to yellow light via absorption of blue light and reemitting yellow light. The surface 18 of the luminescence converter 16 forms the emission surface of the LED 18, which can be characterized by a surface normal 19, indicated by the dashed line.

The absorption probability of the blue light emitted by the active area 15, and thus the probability to be converted to yellow light, is related to the path length of the blue light in the luminescence converter 16. Therefore, light passing through the luminescence converter 16 under a small angle with respect to the surface normal 19 (as indicated by beam direction B1) experiences a smaller absorption probability than light passing through the luminescence converter 16 under a greater angle (as indicated by beam direction B2). Therefore, the percentage of blue light emanating from the emission surface 18 under small angles (as for instance along direction B1) is higher than the percentage of blue light emanating from the emission surface under a greater angle (as for instance along direction B2). Thus, the light observed by an external observer under a small viewing angle with respect to the surface normal is more bluish than light observed under a greater viewing angle, which in fact is more yellowish so that the color impression of the LED 11 depends on the viewing angle.

As shown in FIG. 1A, the light emitted by the emission surface 18 enters the optical element 2 via the light input surface 21. The light passes through the optical element 2 and emanates from the light output surface 22, which in turn has a larger surface area than the light input surface 21. The ratio of the area of the light output surface 22 to the area of the light input surface 21 is chosen to provide the desired collimation needed to achieve the desired beam with at the light output surface 22. The light input surface 21 and the light output surface 22 are connected by flat, non-curved side surfaces 23.

The optical element 2 is made from a transparent material which is, by way of example only, polycarbonate.

Due to the smooth surfaces of the optical element 2, the conservation of etendue as discussed in the general part of the specification tends to apply to both the collimation of the light in the paper plane as shown in FIG. 1 (vertical plane) and to the collimation of light in a plane perpendicular to the paper plane (horizontal plane) independently. Thus, the aspect ratio of the light beam emerging from the light output surface 22 can be changed by the optical element in comparison to the aspect ratio of the light pattern emitted from the emission surface of the light-emitting device. This is shown in greater detail in connection with FIGS. 3A and 3B.

The light input surface 21 is concavely curved and thus hollow inward with respect to the volume of the optical element 2. The curvature of the light input surface 21 is related to the distance and dimension of the emitting surface and to the radiation pattern of the light-emitting device 1. Thus, the light input surface 21 can cover a solid angle which at least is close to the solid angle covered by the light emitted from the emitting surface 18 of the light-emitting device 1. Further, due to the curvature of the light input surface 21 the refraction of light entering the optical element 2 is minimized even at large angles with respect to the surface normal 19. As the light rays entering the optical element 2 are nearly perpendicular to the light input surface 21, the scattering angles are kept small at the light input surface 21 so that an efficiency drop due to scattering can be minimized or even avoided. In contrast, scattering at the light output surface 22 is much more helpful to improve the brightness and/or color homogeneity than scattering at the light input surface 21, since the light comes from an apparently "small" light-emitting device as seen from the light output surface 22. Thus, controlling the scattering and refraction of the light at the light input surface 21 may help to improve the homogeneity of the light emanating from the light output surface 22 and provides a homogeneous magnification of the emission surface 18 by means of the optical element 2 due to the constant curvature of the light input surface 21.

The light input surface 21 can be designed for instance as Boolean difference by "subtracting" an ellipsoid, a sphere or any other suitable curved volume from a cone-like or pyramid-like optical element. The Boolean difference is a well-known construction method which in particular is the difference between two volumes, wherein a second surface, e.g. the ellipsoid or sphere, is "subtracted" from a first volume, e.g. the "raw" optical element, wherein the portion of surfaces and volume of the first volume that is inside the second volume is trimmed away while the remaining portions of surfaces of the first volume are preserved. Further, the portion of surfaces and volume of the second volume that is inside the first volume is preserved, while the rest of the surfaces of the second volume are trimmed away. If a surface is an open surface not enclosing a volume, the direction of the surface with respect to the other volume indicates the "outside" of the surface. Similarly, the light output surface 22 can be designed.

The optical element 2 is arranged with respect to the light-emitting device 1 so that the light input surface 21 faces towards the emission surface 18 of the light-emitting device and so that there is an air gap 3 of at least 1 mm between the light-emitting device and the optical element 2. As described above, the large air gap 3 helps to improve the lifetime of the light source 100 due to thermally insulating the optical element 2 from the light-emitting device 1. Due to the concave curvature of the light input surface 21 a large fraction of up to 90 percent and more of the light emitted by the light-emitting device can be efficiently coupled into the optical element 2 even at such large gap 3. Due to the concave curvature the area of the light input surface 21 can be kept at moderate size with respect to the area of the emission surface 18. By way of example only, in the shown embodiment the ratio of the light input surface area and the emission surface area is about 4.

As indicated in FIG. 1A by exemplary light rays D1, D2 and D3, a first part of the electromagnetic radiation emitted from the light-emitting device enters the optical element 2 via the light input surface 21 and passes through the optical element 2 directly to the light output surface 22. The first part of electromagnetic radiation thereby illuminates the whole light output surface 22. Since the first part of the light directly illuminating the light output surface 22 is emitted from the emission surface 18 of the light-emitting device 1 under small angles with respect to the surface normal 19 of the emission surface 18, the first part of the light appears to be more bluish, as described above in connection with FIG. 1B. A second part of the electromagnetic radiation, indicated by exemplary light rays I1, I2 and I3, enters the optical element 2 via the light input surface 21 and impinges the side surface 23. At the side surfaces 23 the second part of the electromagnetic radiation is reflected via total internal reflection towards the light output surface 22. The second part of electromagnetic radiation illuminates the whole light output surface 22 indirectly after being reflected at the side surfaces 23. Since the second part of the light indirectly illuminating the light output surface 22 is emitted from the emission surface 18 of the light-emitting device 1 under larger angles with respect to the surface normal 19 of the emission surface 18 than the first part of the electromagnetic radiation, the second part of the light appears to be more yellowish, as described above in connection with FIG. 1B.

Therefore, since the direct rays, forming the first part of electromagnetic radiation, are emitted from the light-emitting device in near surface normal direction 19 and the indirect rays, which are reflected at the side surfaces 23 and which form the second part of the electromagnetic radiation, are emitted from the light-emitting device in direction pointing further away from the surface normal 19, and both the direct and indirect rays illuminate the whole light output surface 22, the more bluish first part of electromagnetic radiation and the more yellowish second part of electromagnetic radiation are well mixed in the beam emerging from the light output surface 22. Therefore, the light source 100 provides excellent color homogeneity of the emitted light, in particular in the far field.

Figure 1B:
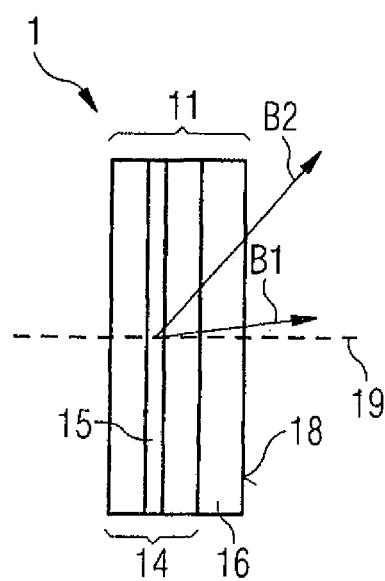
Figure 2:
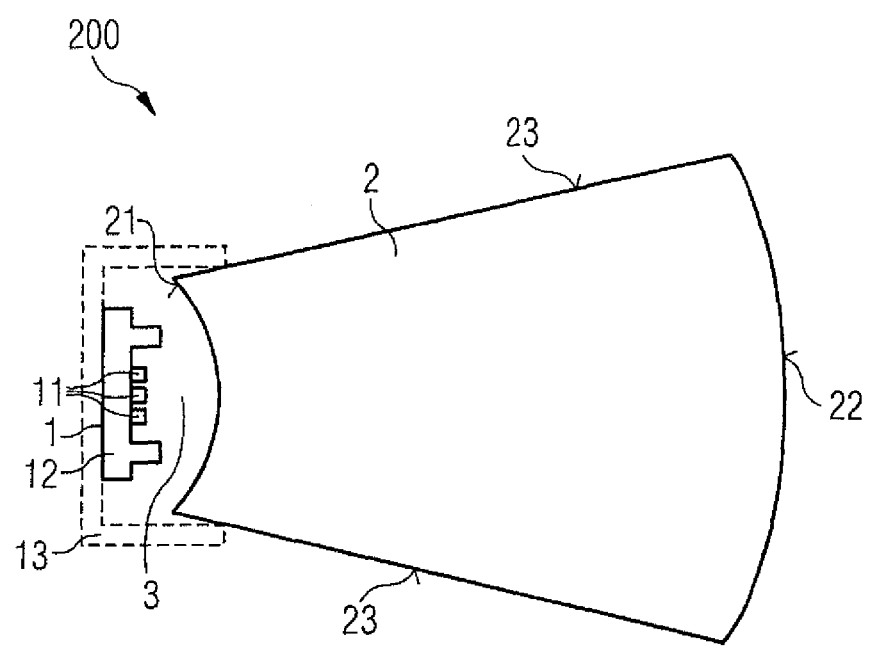
Figure 3A:
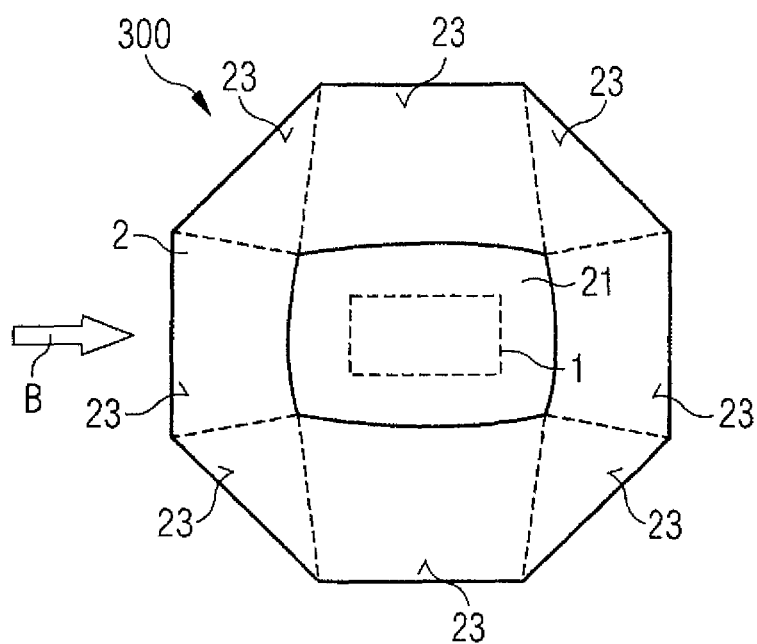
Figure 3B:
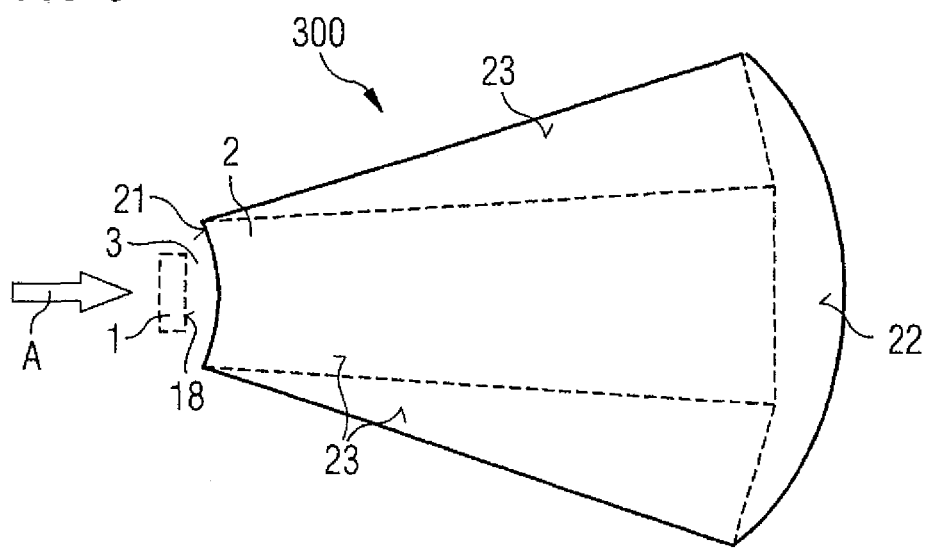

In the following FIGS. 2 to 3B show in further embodiments modifications of the light source 100 so that only the differences to the embodiment of FIGS. 1A and 1B are described.

The light source 200 as shown in a cross-sectional view in FIG. 2 includes a light-emitting device 1, which comprises a plurality of LEDs 11. The plurality of LEDs 11 is arranged in a housing 12 and is formed as a rectangular array of 2 by 3 LEDs. The housing 12 may be positioned on holding means 13, which also support the optical element 2, as indicated by the dashed lines. Alternatively, the holding means 13 can be part of the housing 12.

The light output surface 22 of the optical element 2 is convexly curved, thus bulging outwards with respect to the volume of the optical element 2. The convex curvature can act like a lens and provide further collimation or scattering of the light emitted form the light output surface 22.

FIGS. 3A and 3B show a further embodiment of a light source 300 in two top views, wherein the view in FIG. 3A is along direction A indicated in FIG. 3B and the view in FIG. 3B is along direction B indicated in FIG. 3A.

The light-emitting device 1, only indicated by the dotted line, is similar to the light-emitting device as shown in connection with FIG. 2, in particular comprising an LED-array of 2 by 3 LEDs.

The optical element 2 of light source 300 has a convexly curved light output surface 22 as shown in FIG. 2 and an octagonal cross-section with an octagonal perimeter. The light input surface 21 has a perimeter which is—according to the rectangular shape of the emission surface 18 of the light-emitting device 1—rectangular in an elliptical geometry as described above. The side surfaces 23 connection the light input surface 21 to the light output surface 22 are of triangle and trapezoid shape in order to transform the rectangular shaped perimeter of the light input surface 21 into the octagonal shaped perimeter of the light output surface 22. As described above, the optical element 2 of light source 300 changes the aspect ratio of the light pattern emitted by the light-emitting device 1, which is affected by the rectangular shape of the emission surface 18, into a more symmetric beam shape with an aspect ratio of 1. Without the triangular side surfaces 23, i.e. if the perimeter of the light output surface was square shaped, the beam emerging from the light output surface 22 would be essentially square. The triangular sides 23 "cut off" the "corners" of that light distribution, thus creating an essentially round far field distribution of the light beam emitted from the light output surface 22.

In the following FIGS. 4A to 4C simulations of the light beam emitted from the light output surface 22 of light source 300 are shown. For those particular simulations a distance of 1.3 mm was chosen between the emission surface 18 of the light-emitting device 1, which was assumed to be the 2 by 3 LED-array as described above, and the light input surface 21 of the optical element 2. The area of the emission surface 18 was 6.59 mm$^2$ with a perimeter length of 10.50 mm, wherein each of the LEDs had an area of about 1 mm$^2$. The light flux of each LED was assumed to be 0.97 lm yellow light and 0.3 lm blue light, resulting in a total Lambertian light flux of 6 lm of the light-emitting device 1. Absorption in the polycarbonate optical element 2 was neglected. The area of the light input surface 21 was assumed to be 28.68 mm$^2$ with a perimeter length of 21.05 mm. These settings resulted in the coupling of 88 percent of the light emitted by the light-emitting device 1 into the optical element 2. The length of the optical element 2, i.e. the distance between the light input surface 21 and the light output surface 22 and the area of the light output surface 22 where chosen to result in a beam emitted from the output surface with an opening angle of about 38° from both the direct and indirect light rays, i.e. the first and the second part of the electromagnetic radiation as described above. The opening angle was considered as the opening angle of a cone with its tip behind the center of the emission surface 18 of the light-emitting device 1. The opening angle chosen was to create approximately equal proportions of the first and the second part of the electromagnetic radiation.

Figure 4A:
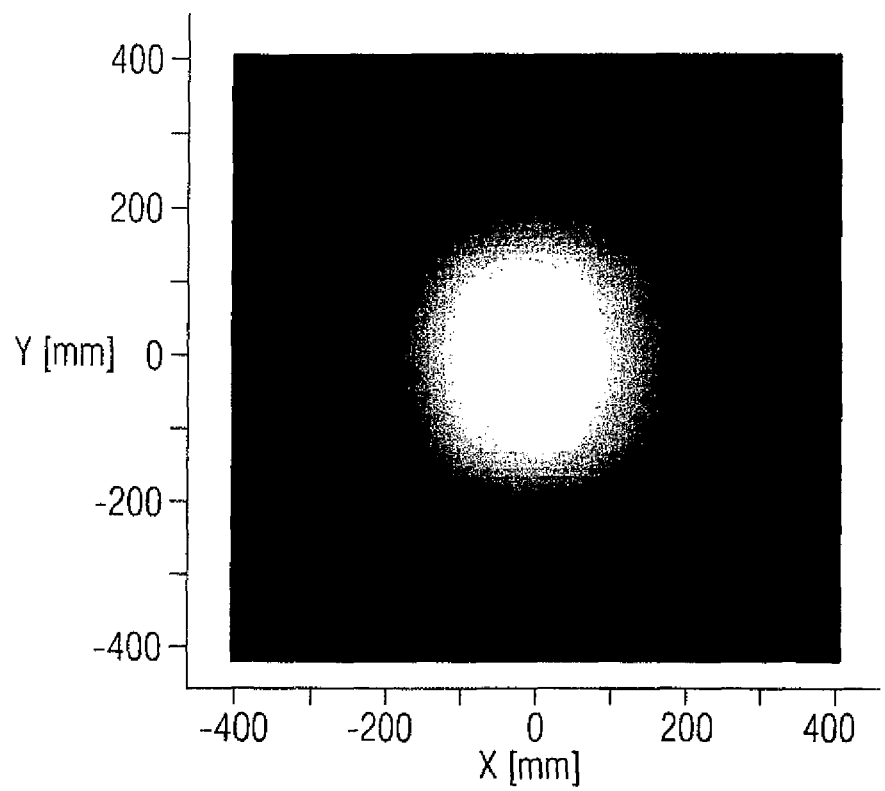
FIGS. 4A to 6 show measurements of the beam characteristics of light sources according to various embodiments.
Figure 4B:
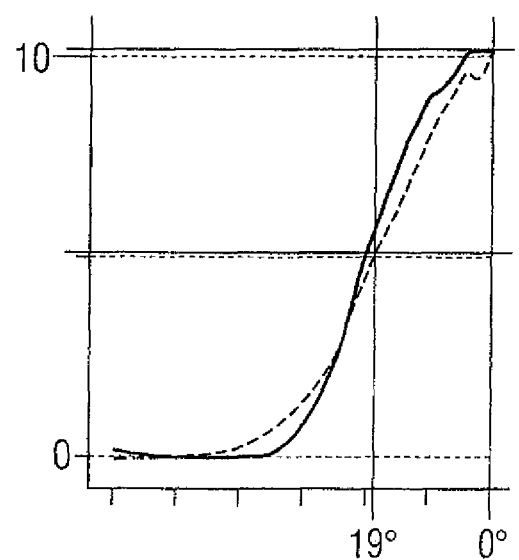
Figure 4C:
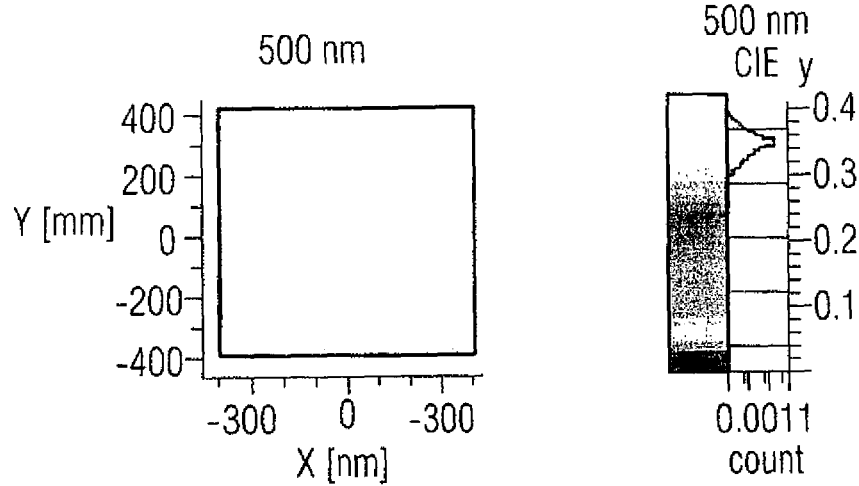
Figure 4C:
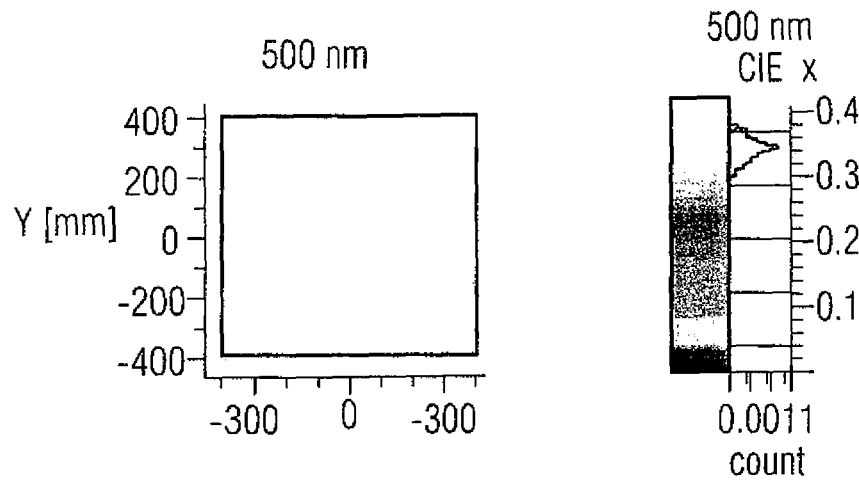

In FIG. 4A the simulated beam pattern at a position of 500 mm behind the light output surface 22 is shown, for which 300 million rays have been simulated. As it can be seen, the beam emerging from the light output surface 22 has a circular shape in the far field and contains no visible patterns or inhomgeneities in brightness or color. FIG. 4B shows the brightness distribution in horizontal and vertical direction (solid and dashed lines) from the center of the beam in FIG. 4A. The brightness distribution shows the desired opening angle of 38° (note that in FIG. 4B half the opening angle of 19° is indicated at half of the maximum brightness) and a smooth intensity decrease from the center of the beam. The drop of intensity is less than 10 percent at an opening angle of 30°. The efficiency of the simulated light source is 75 percent at the wall at a distance of 500 mm. FIG. 4C shows the color distribution in CIE x and y coordinates. As can be seen easily, there is no visible inhomogeneity in the color distribution.

Therefore, the disclosed light source provides good white color mixing, wherein the inhomogeneous radiation pattern of the LEDs 11 are homogenized by means of the single optical element 2 resulting in a uniform and homogeneous output light beam.

Figure 5:
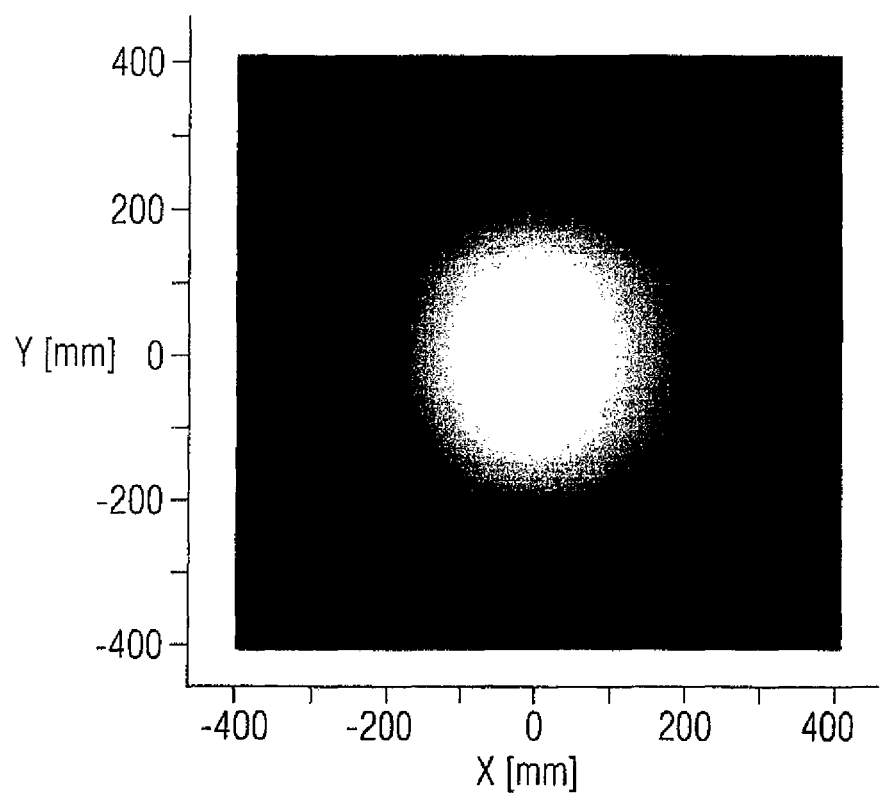

FIG. 5 shows the simulation of a light source similar to the light source described in connection with FIGS. 4A to 4C, where the gap between the light-emitting device 1 and the optical element 2 was reduced by 0.3 mm to 1 mm. In this simulation a slight increase in efficiency of 78% with a slightly lower peak intensity (lower by 5%) and a slightly wider beam pattern characterized by an opening angle of 40° was obtained. As in the simulation described before, no color or brightness inhomgeneities where obtained.

Figure 6:
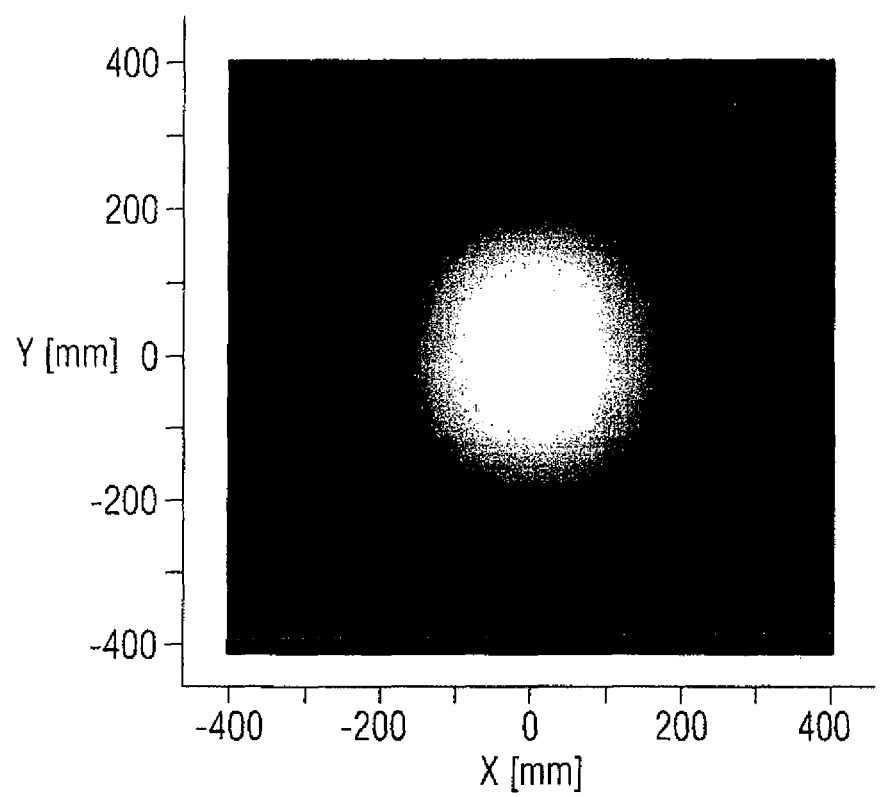

FIG. 6 shows the simulation of a light source similar to the light source described in connection with FIGS. 4A to 4C, where the light-emitting device was laterally shifted by 0.3 mm from its center position. Compared to the simulation shown in connection with FIGS. 4A to 4C a slight decrease in efficiency was obtained (74%), whereas no difference in beam pattern and beam homogeneity was obtained.

The simulations show that the embodiments of the light source as described in the general part of the description as well as in connection with the Figures provide—in contrast to commonly used reflectors, lenses, lens arrays and/or diffusive structures—an efficient light coupling between the light-emitting device 1 and the optical element 2, a homogeneous brightness and color distribution at the light output surface 22 and in the far field, tolerance against alignment and manufacturing deviations and errors, as the light source provides a homogeneous magnification of the emission surface which is evenly distributed among the various light paths as seen from far away. The light source further provides a high life time, requires only little space and ensures the illumination of objects without creating multiple colored shadows on walls behind those objects, even if LED arrays are used in light-emitting device.

The scope of the invention is not limited to the exemplary embodiments described herein. The invention is embodied in any novel feature and any novel combination of features which include any combination of features which are disclosed herein as well as stated in the claims, even if the novel feature or the combination of features are not explicitly stated in the claims or in the embodiments.

The invention claimed is:

1. A light source, comprising:
a light-emitting device to emit electromagnetic radiation from an emitting surface; and
an optical element having a light input surface, a light output surface, and side surfaces connecting the light input surface to the light output surface;
wherein:
the entire light input surface is located in the optical path of the light-emitting device, in front of the emitting surface, so that the electromagnetic radiation enters the optical element through the light input surface;
the light input surface has a concave curvature and an area smaller than an area of the light output surface;
the entire light input surface is separated from the emitting surface by a distance greater than or equal to about 0.8 mm and less than or equal to about 2 mm, forming a gap between the light-emitting device and the optical element; and
a first bluish part of the electromagnetic radiation directly and completely illuminates the entire light output surface; and
a second yellowish part of the electromagnetic radiation completely illuminates the entire light output surface after being reflected by the side surfaces towards the light output surface.

2. The light source of claim 1, wherein the light input surface is a part of an ellipsoid, a sphere, an elliptical paraboloid, or any mixture thereof.

3. The light source of claim 1, wherein the light input surface has a perimeter with a polygonal shape.

4. The light source of claim 3, wherein the perimeter of the light input surface has a rectangular shape.

5. The light source of claim 1, wherein the side surfaces are plane surfaces.

6. The light source of claim 1, wherein the light output surface has a curvature.

7. The light source of claim 6, wherein the light output surface has a convex curvature.

8. The light source of claim 1, wherein the light output surface has a perimeter having a polygonal shape.

9. The light source of claim 8, wherein the perimeter of the light output surface has an octagonal shape.

10. The light source of claim 1, wherein the optical element is non-imaging.

11. The light source of claim 1, wherein the optical element comprises polycarbonate.

12. The light source of claim 1, wherein the light-emitting device comprises at least one light-emitting diode.

13. The light source of claim 12, wherein the light-emitting device comprises an array of light-emitting diodes.

14. The light source of claim 1, wherein the area of the light input surface of the optical element is larger than an area of the emitting surface of the light-emitting device.

15. The light source of claim 14, wherein
a ratio of the area of the light input surface to the area of the emitting surface is equal to or greater than about 2 and equal to or smaller than about 5.

16. The light source of claim 1, wherein a part of the electromagnetic radiation entering the optical element impinges on the side surfaces and is reflected via total internal reflection.

17. The light source of claim 1, further comprising:
a semiconductor layer sequence emitting blue light; and
a luminescence converter to convert part of the blue light to yellow light.

* * * * *